United States Patent
Yue et al.

(10) Patent No.: US 7,435,672 B2
(45) Date of Patent: Oct. 14, 2008

(54) METAL-GERMANIUM PHYSICAL VAPOR DEPOSITION FOR SEMICONDUCTOR DEVICE DEFECT REDUCTION

(75) Inventors: Doufeng Yue, Plano, TX (US); Noel Russell, Plano, TX (US); Peijun J. Chen, Dallas, TX (US); Douglas E. Mercer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 322 days.

(21) Appl. No.: 10/903,716

(22) Filed: Jul. 30, 2004

(65) Prior Publication Data

US 2006/0024963 A1    Feb. 2, 2006

Related U.S. Application Data

(63) Continuation-in-part of application No. 10/896,599, filed on Jul. 21, 2004, now Pat. No. 7,029,967.

(51) Int. Cl.
*H01L 21/3205* (2006.01)

(52) U.S. Cl. .................................. 438/592; 438/652
(58) Field of Classification Search ............... 438/197, 438/592, 585, 652, 655, 656, 657
See application file for complete search history.

(56) References Cited

U.S. PATENT DOCUMENTS 6,787,864 B2 *    9/2004    Paton et al. ................. 257/412

* cited by examiner

*Primary Examiner*—Jack Chen
(74) *Attorney, Agent, or Firm*—Wade J. Brady, III; Frederick J. Telecky, Jr

(57) ABSTRACT

The present invention provides a method of manufacturing a metal silicide electrode (100) for a semiconductor device (110). The method comprises depositing by physical vapor deposition, germanium atoms (120) and transition metal atoms (130) to form a metal-germanium alloy layer (140) on a semiconductor substrate (150). The metal-germanium alloy layer and the semiconductor substrate are reacted to form a metal silicide electrode. Other aspects of the present invention include a method of manufacturing an integrated circuit (400).

16 Claims, 3 Drawing Sheets

METAL-GERMANIUM PHYSICAL VAPOR DEPOSITION FOR SEMICONDUCTOR DEVICE DEFECT REDUCTION

CROSS-REFERENCE TO RELATED APPLICATIONS

This application is a continuation-in-part of U.S. application Ser. No. 10/896,599 entitled, "Suicide Method for CMOS Integrated Circuits," filed on Jul. 21, 2004, now U.S. Pat. No. 7,029,967, and which is commonly assigned with the present invention, and incorporated by reference as if reproduced herein in its entirety.

TECHNICAL FIELD OF THE INVENTION

The present invention is directed, in general, to a method for manufacturing a semiconductor device, and more specifically, to a method for manufacturing devices having metal silicide electrodes thereon.

BACKGROUND OF THE INVENTION

The continuing push to produce faster semiconductor devices with lower power consumption has resulted in transistor miniaturization and higher integrated circuit packing densities with each new technology node. For instance, transistors with smaller components allow a higher packing density, which is conducive to faster device operating speeds. Along with shrinking transistor geometries, however, also come a number of challenges to optimize both transistor and integrated circuit (IC) layout design.

One consequence of transistor miniaturization is the construction of smaller gates and source/drain regions in transistors. This, in turn, has caused changes in the composition and construction of the source/drain electrodes used to facilitate device interconnection. To produce a transistor with a sufficiently low series resistance, each transition to a new technology node, has seen the source/drain electrode's composition change from titanium silicide, to cobalt silicide, and now nickel silicide.

Unfortunately a number of problems have been encountered when manufacturing transistors with nickel silicide source/drain electrodes. In some cases, unacceptable numbers of nonfunctional transistors are constructed. In other instances, the source and drain regions punch through the source/drain junction into the semiconductor substrate, resulting in a large leakage current. In still other cases, there is an unacceptably large diode leakage between the source and drain regions and the semiconductor substrate. These problems contribute to the production of unacceptably low yields of transistors that operate within performance specifications.

Accordingly, what is needed in the art is method of manufacturing a semiconductor device with metal silicide source/drain electrodes that do not suffer from the disadvantages associated with conventionally manufactured metal silicide source/drain electrodes, as discussed above.

SUMMARY OF THE INVENTION

To address the above-discussed deficiencies of the prior art, the present invention provides in one embodiment, a method of manufacturing a metal silicide electrode for a semiconductor device. The method comprises depositing by physical vapor deposition, germanium atoms and transition metal atoms to form a metal-germanium alloy layer on a semiconductor substrate. The method further comprises reacting the metal-germanium alloy layer and the semiconductor substrate to form a metal silicide electrode.

Another aspect of the present invention is a method of manufacturing an integrated circuit. This embodiment includes forming metal silicide electrodes on a semiconductor device as described above. The method also includes forming interconnect metals lines on one of more insulating layers located over the semiconductor device and connecting the interconnects with the metal silicide electrodes to form an operative device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
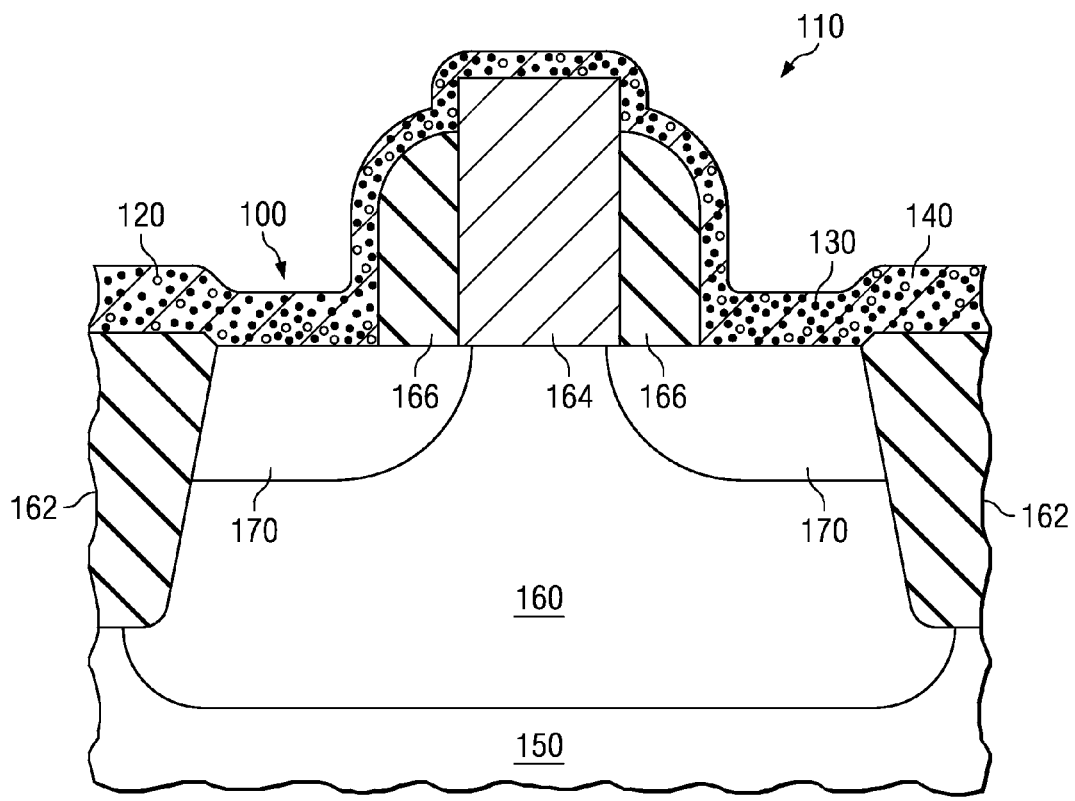
FIGS. 1-3 illustrate cross-sectional views of selected steps in an exemplary method of manufacturing a metal silicide electrode for a semiconductor device according to the principles of the present invention.

During the course of studying transmission electron microscope (TEM) images of pMOS transistors having nickel silicide source/drain electrodes, vertical excessive encroachment defects (mostly spike-shaped) were detected. It was further observed that the spikes were portions of the source/drain electrodes that protruded into the source/drain region of the transistors. In some cases, the spikes protruded through the entire source/drain region, while in other cases, the spikes made the interface between a source/drain electrode and a source/drain region irregular.

While not limiting the scope of the present invention by theory, it is thought that the spikes form due to the generation of non-uniform defective sites or channels in the semiconductor substrate when dopants, such as boron, are implanted into the source/drain regions of the substrate. These high free-energy defective areas will serve as preferred Nickel disilicide nucleation sites to form nickel disilicide nuclei when a nickel layer over the source/drain regions is reacted with the underlying silicon to form nickel silicide source/drain electrodes. It is further thought that additional thermal treatment after metal silicide formation promotes the growth of nickel disilicide nuclei along the <111>crystal plane of silicon to form nickel disilicide spikes.

It is further believed that the spike-shaped defects can either cause poor transistor performance characteristics or reduce the yield of functional transistors. The presence of spikes is thought to increase the series resistance of the transistor because the interface between the source/drain electrode and the source/drain junction is rendered irregular from the presence of spikes. A large surface area associated with an irregular surface causes increased resistance. A higher series resistance, in turn, can reduce the speed at which the transistor can operate and reduce the current output of the transistor. In addition, the high nickel disilicide content of the spikes is thought to increase series resistance because the electrical resistance of nickel disilicide is at least about 3 to 5 times higher than nickel monosilicide.

To reduce spike formation, germanium atoms can be implanted into the source/drain region before depositing a nickel layer and reacting the nickel with the silicon substrate to form nickel silicide source/drain electrodes. Implanting germanium atoms is thought to: (1) amorphise the substrate surface which breaks up channels created by boron implantation, and (2) place germanium atoms at substitutional sites after source/drain region annealing. This will form a high free-energy nickel disilicide nuclei along the <111>crystal plane of silicon to form nickel disilicide spikes.

It is further believed that the spike-shaped defects can either cause poor transistor performance characteristics or reduce the yield of functional transistors. The presence of spikes is thought to increase the series resistance of the transistor because the interface between the source/drain electrode and the source/drain junction is rendered irregular from the presence of spikes. A large surface area associated with an irregular surface causes increased resistance. A higher series resistance, in turn, can reduce the speed at which the transistor can operate and reduce the current output of the transistor. In addition, the high nickel disilicide content of the spikes is thought to increase series resistance because the electrical resistance of nickel disilicide is at least about 3 to 5 times higher than nickel monosilicide.

To reduce spike formation, germanium atoms can be implanted into the source/drain region before depositing a nickel layer and reacting the nickel with the silicon substrate to form nickel silicide source/drain electrodes. Implanting germanium atoms is thought to: (1) amorphise the substrate surface which breaks up channels created by boron implantation, and (2) place germanium atoms at substitutional sites after source/drain region annealing. This will form a high energy zone zone due to silicon lattice distortion caused by atom size difference of the semiconductor substrate in the vicinity of the source/drain region, thereby preventing nickel atoms from diffusing through the channels and forming nickel disilicide spikes. Transistors implanted with germanium as described above have reduced numbers spikes and decreased series resistance. Unfortunately the germanium-implanted transistors still have a higher than desired leakage current for some applications.

While not limiting the scope of the present invention by theory, it is believed that germanium implantation to amorphize the surface regions of the substrate also can damage regions deep within the substrate. The damage can cause an increased diode leakage between the source/drain region and the substrate. The present invention addresses this problem by introducing germanium atoms to the source/drain region by physical vapor deposition (PVD). The use of PVD to introduce germanium to the source/drain region avoids substrate damage associated with germanium-implantation. Consequently, the current leakage of transistors whose electrode fabrication includes PVD-deposited germanium is lower that the leakage current of transistors whose electrode fabrication includes implanting germanium. It is thought that germanium atoms deposited on the surface of the source/drain region can impede the diffusion of Ni through the substrate, thereby preventing the formation of the spikes.

The above discussion presents aspects of the present invention in the context of nickel silicide electrode induced defects in dopant-implanted source/drain regions of an pMOS transistor. It is emphasized, however, that the scope of the present invention includes reducing such defects in any semiconductor substrate caused by the formation of any electrode comprising a transition metal silicide.

For the purposes of the present invention, a transition metal is defined as any element in Periods 4-6 and Groups 3-12 of the Periodic Table of Elements (International Union of Pure and Applied Chemist Convention for designating Groups and Periods).

One embodiment of the present invention is a method of manufacturing a metal silicide electrode. FIGS. 1 to 6 illustrate cross-sectional views of selected steps in exemplary methods of manufacturing a metal silicide electrode 100 for a semiconductor device 110 according to the principles of the present invention.

Turning first to FIG. 1, illustrated is the partially constructed metal silicide electrode 100 after depositing by physical vapor deposition, germanium atoms 120 and transition metal atoms 130 to form a metal-germanium alloy layer 140 on a semiconductor substrate 150.

In some advantageous embodiments of the method, the MOS semiconductor substrate 150 comprises silicon, although other conventional substrate materials, such as silicon-on-insulator (SOI) and silicon-germanium substrates, are also within the scope of the invention. For example, the semiconductor substrate 150 can comprise a layer located below the partially completed semiconductor device 150, and include a silicon wafer itself or a layer located above the wafer as an epitaxial layer, such as a silicon layer of SOI substrate, or other substrate. Some preferred embodiments of the MOS semiconductor substrate 150 include <100>silicon wafers having a 0 degree or a 45 degree cut. Other types of silicon wafers, such as <111>or <011>wafers, and silicon wafers having different cut angles, can also be used, however.

The semiconductor substrate 150 preferably includes a well 160 that is doped with a p-type dopant, such as boron, or an n-type dopant, such as arsenic, when the semiconductor device 110 comprises an nMOS or a pMOS transistor, respectively. Other components of the semiconductor device 110, such as isolation 162, a gate 164, and gate sidewall 166 structures can be formed on or in the semiconductor substrate 150 using conventional techniques.

As further illustrated in FIG. 1, in some preferred embodiments of the method, the germanium atoms 120 and transition metal atoms 130 are blanket deposited as the alloy layer 140 over the entire surface of the semiconductor substrate 150, and preferably on conventionally formed source/drain regions 170 that are located in the substrate 150. As depicted in FIG. 1, in some cases, it is preferable to co-deposit germanium atoms 120 and transition metal atoms 130 because only a single PVD step is then required. Moreover, co-deposition facilitates a homogenous mixture of germanium atoms 120 and transition metal atoms 130 in the metal-germanium alloy layer 140. In some instances, the germanium alloy metal layer 140 has a thickness of between about 5 nanometers and about 30 nanometers.

In some embodiments of the method, the transition metal atoms 130 comprise nickel. The transition metal atoms 130 can comprise titanium, cobalt and combinations transition metals such as nickel and platinum or nickel and palladium. Nickel, however, is preferred for a number of reasons. Nickel silicide formation can be performed using relatively low temperatures as compared to other metals. This, in turn, reduces the thermal budget that the device 110 is exposed to during its manufacture, thereby improving device yields and reducing manufacturing costs. Nickel silicide has a low resistivity as compared to a number of other transition metal silicides. This is important for maintaining the series resistance of the semiconductor device 110 within acceptable limits when constructing smaller, faster devices. Moreover, nickel silicide is not prone resistivity degradation due to the necking phenomenon observed when using other metal silicides, such as cobalt silicide, at device feature sizes of less than about 90 nanometers.

A preferred PVD method is sputtering. In some preferred embodiments, sputtering is from a nickel germanium alloy target. A sputtering target with a low germanium content is desirable because this helps ensure that localized regions of $Ni_3Ge$ do not form in the metal-germanium alloy layer 140. In advantageous embodiments, for instance, the nickel germanium alloy target comprises less than about 10 atom percent germanium, and more preferably less than about 5 atom percent germanium. In still other embodiments the nickel germanium alloy target comprises between about 0.1 and about 5 atom percent germanium.

In some preferred embodiments of the method, sputtering a direct current power of about 600 Watts a sputtering chamber vapor pressure of about 5 Torr. One of ordinary skill in the art would understand how to adjust the select the sputtering method and conditions to deposit germanium atoms 120 and transition metal atoms 130. Of course, sputtering can be accomplished using other techniques including alternating current, radio frequency, magnetron or other commercially available sputtering systems. Moreover, other, conventional PVD techniques including evaporative deposition, molecular beam epitaxy, ion plating, ion beam assisted deposition using an electron beam evaporator and arc vapor deposition are also within the scope of the present invention.

In certain preferred embodiments of the method, the metal-germanium alloy layer 140 has substantially the same nickel and germanium concentration as the nickel germanium alloy target. In some embodiments the metal-germanium alloy layer 140 has a germanium content of less than 10 atom percent and more preferably less than about 5 atom percent. A germanium concentration of at least about 0.1 percent is desirable to ensure that there are is sufficient numbers of germanium atoms 120 to prevent the diffusion of the transition metal atoms 130 during subsequent metal silicidation reactions.

Figure 2:
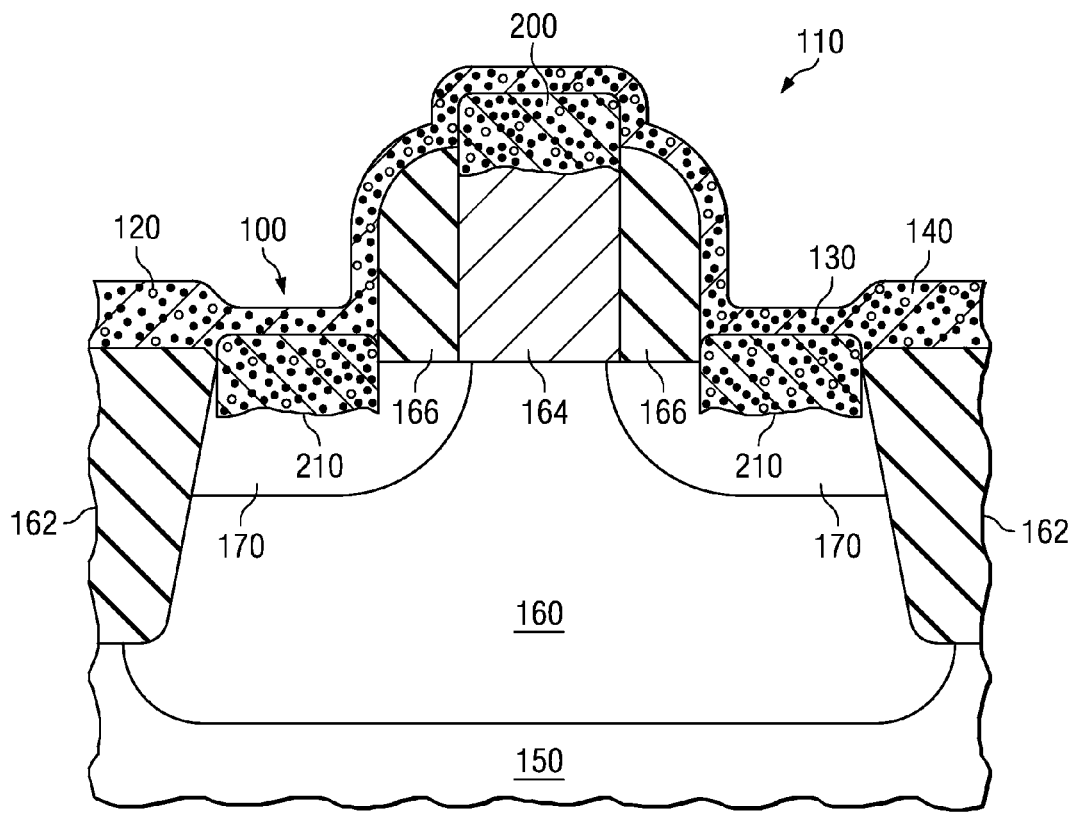

With continuing reference to FIG. 1, FIG. 2 depicts the partially completed metal silicide electrode 100 after reacting the metal-germanium alloy layer 140 and the semiconductor substrate 150. The metal-germanium alloy layer 140 reacts with a portion of the source/drain region 170, resulting in the metal silicide electrode 100 being formed on the source/drain region 170. As further illustrated in FIG. 2, a metal silicide gate electrode 200 can also be formed by the reacting the metal-germanium alloy layer 140 with a portion of the gate structure 164, when the gate structure comprises silicon.

In certain advantageous embodiments of the method, the metal silicide electrode 100 comprises nickel silicide, and more preferably, nickel monosilicide. In some advantageous embodiments, metal silicide electrode 100 has a thickness that is between about 1 and about 3 times the thickness of the metal-germanium alloy layer 140 shown in FIG. 1. In some preferred embodiments, the metal silicide electrode 100 has a thickness of between about 10 nanometers and about 60 nanometers.

In some preferred embodiments of the method, an interface 210 between the metal silicide electrode 100 and the semiconductor substrate 150 has an average roughness of less than about 40 percent. The term roughness as used herein refers to the average percent deviation in the thickness of the metal silicide electrode 100 at the interface 210 between silicide electrode 100 and the semiconductor substrate 100. More preferably, the interface 210 is between the metal silicide electrode 100 and the source/drain region 170 of the substrate 150. One of ordinary skill in the art would understand how to measure the roughness. As an example, the average and standard deviation of the thickness of the metal silicide electrode 100 can be measured at a plurality of locations (e.g., at least about 20 locations) in a TEM image cross-section of the semiconductor substrate 150, and then the percent standard deviation in the thickness calculated.

In some advantageous embodiments of the method, the reaction to form the metal silicide electrode 100 comprises heating the metal-germanium alloy layer 140 and the semiconductor substrate 150 to between about 250° C. and about 550° C. for at least about 0.1 second. In other advantageous embodiments, heating comprises a first heating step to a temperature between about 250° C. and about 350° C. for at least about 0.1 second to form the metal silicide 100, and a second heating step to a temperature of between 350° C. and 550° C. for at least about 0.1 second to anneal the metal silicide 100. In some cases, it is desirable to heat to a temperature below about 400° C. to deter the formation of nickel disilicide. In still other cases, it is preferable to remove the unreacted portions of the metal-germanium alloy layer 140 between the first heating step and the second heating step. One of ordinary skill in the art would understand how to adjust the temperature and duration of heating to achieve silicidation of different transition metals.

Figure 3:
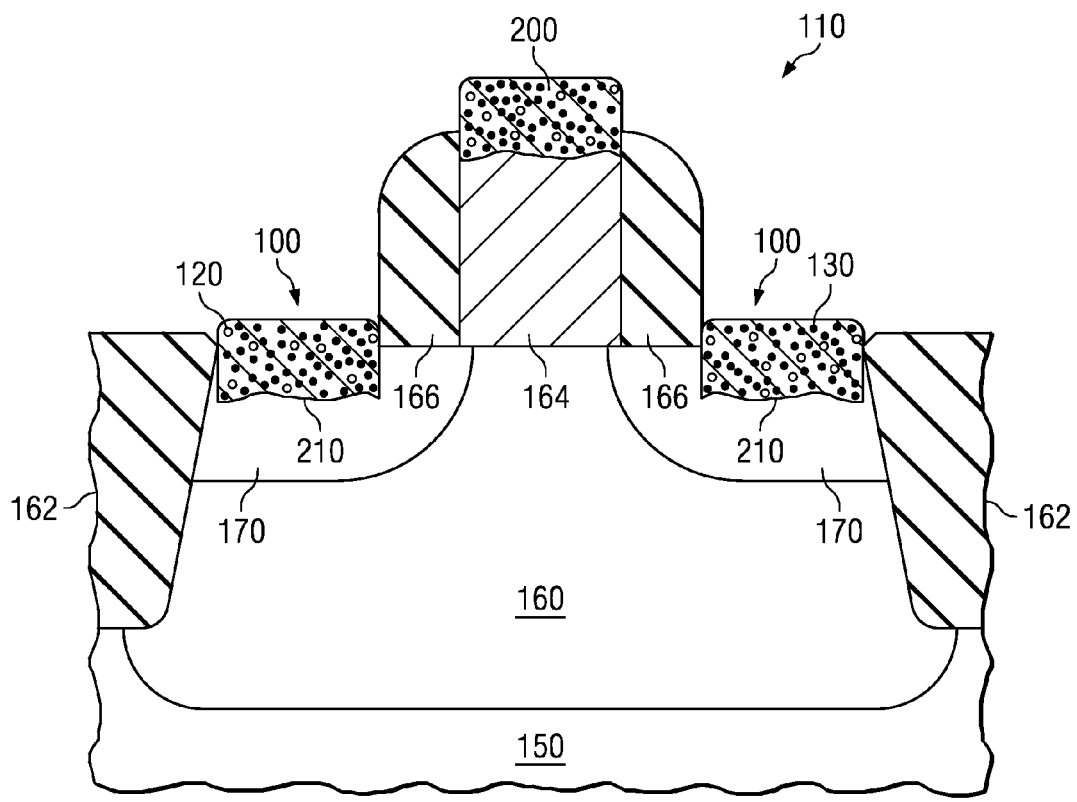

Turning now to FIG. 3, with continuing reference to FIGS. 1-2, illustrated is the metal silicide electrode 100 after removing unreacted portions of the metal-germanium alloy layer 140 shown in FIG. 2. Suitable methods to remove the unreacted portions of the metal-germanium alloy layer 140 include dry and wet etch procedures. One of ordinary skill in the art would understand how to tailor these procedures to selectively remove the metal-germanium alloy layer 140 while leaving the metal silicide electrode 100 substantially intact.

Also included in the scope of the present invention is a metal silicide electrode 100, or the semiconductor device 110 comprising one or more metal silicide electrodes 100, manufactured as described above. In some preferred embodiments, the semiconductor device 110 is a MOS transistor and more preferably a pMOS transistor. Of course, additional conventional steps in semiconductor device 110 fabrication can be included with the above-described method of manufacturing metal silicide electrodes to make an operative device.

Figure 4:
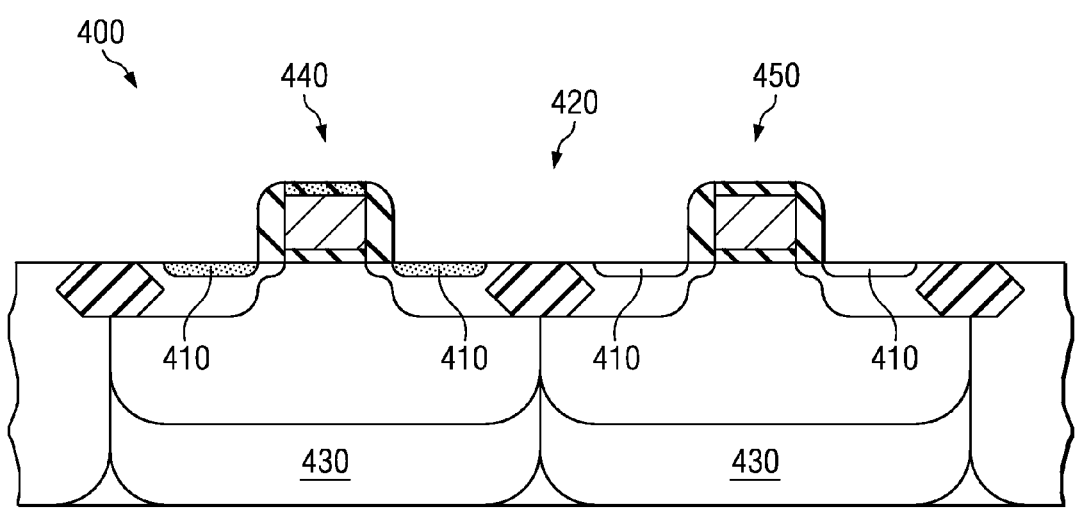
FIGS. 4-5 illustrate cross-sectional views of selected steps in an exemplary method of manufacturing an integrated circuit following the principles of the present invention.
Figure 5:
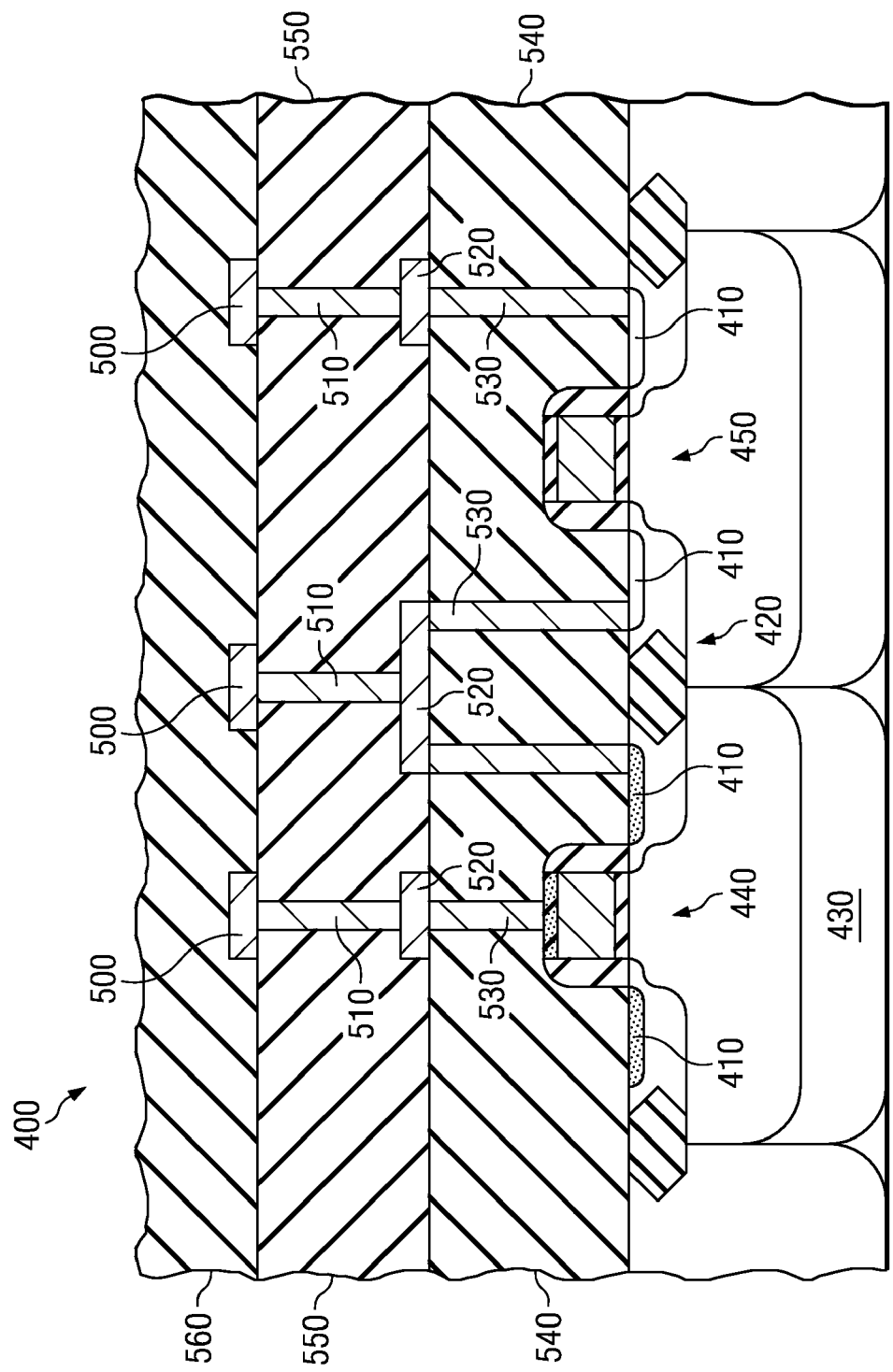

Another aspect of the present invention is a method of manufacturing an integrated circuit. FIGS. 4-5 illustrate cross-sectional views of selected steps in an exemplary method of manufacturing an integrated circuit 400 according to the principles of the present invention. Turning first to FIG. 4, illustrated is the partially completed integrated circuit 400 after forming metal silicide electrodes 410 for a semiconductor device 420. Any of the methods and materials discussed above and illustrated in FIGS. 1-3 can be used to fabricate metal silicide electrodes 410 on a semiconductor substrate 430.

Preferred embodiments of the semiconductor device 420 comprise an MOS transistor 440, and more preferably, a pMOS transistor. The semiconductor device 420 can further include other conventionally formed transistors 450 such as an nMOS transistor. In some cases, the semiconductor device 420 comprises a CMOS device. However the semiconductor device 420 can also comprise Junction Field Effect transistors, bipolar transistors, biCMOS transistors, or other conventional device components, and combinations thereof.

With continuing reference to FIG. 4, FIG. 5, illustrates the integrated circuit 400 after forming interconnections 500, 510, 520, 530 on one or more insulating layers 540, 550, 560 located over the semiconductor device 420. One or more of the interconnections 500, 510, 520, 530 are connected to the metal silicide electrodes 410 and thereby interconnect the semiconductor device 420 to form an operative device.

Although the present invention has been described in detail, those skilled in the art should understand that they can make various changes, substitutions and alterations herein without departing from the scope of the invention in its broadest form.

What is claimed is:

1. A method of manufacturing a metal silicide electrode for a semiconductor device, comprising:
   co-depositing by physical vapor deposition, a homogeneous mixture consisting of germanium atoms and transition metal atoms to form a metal-germanium alloy layer on a semiconductor substrate; and
   reacting said metal-germanium alloy layer and said semiconductor substrate to form a metal silicide electrode.

2. The method as recited in claim 1, wherein said transition metal atoms comprise nickel.

3. The method as recited in claim 1, wherein physical vapor depositing comprises sputtering from a nickel germanium alloy target.

4. The method as recited in claim 3, wherein said nickel germanium alloy target comprises less than about 10 atom percent germanium.

5. The method as recited in claim 3, wherein said nickel germanium alloy target comprises less than about 5 atom percent germanium.

6. The method as recited in claim 3, wherein said nickel germanium alloy target comprises between about 0.1 and about 5 atom percent germanium.

7. The method as recited in claim 3, wherein said metal-germanium alloy layer has substantially the same nickel and germanium concentration as said nickel germanium alloy target.

8. The method as recited in claim 3, wherein sputtering includes a direct current power of about 600 Watts a sputtering chamber vapor pressure of about 5 Torr.

9. The method as recited in claim 1, wherein reacting comprises heating said metal-germanium alloy layer and said semiconductor substrate to between about 250° C. and about 550° C. for at least about 0.1 second.

10. The method as recited in claim 1, wherein reacting comprises heating said metal-germanium alloy layer and said semiconductor substrate to between about 250° C. and about 350° C. for at least about 0.1 second.

11. The method as recited in claim 1, wherein said metal silicide electrode comprises nickel silicide.

12. The method as recited in claim 1, wherein said metal silicide electrode comprises source/drain electrodes in a MOS transistor.

13. The method as recited in claim 1, wherein said metal silicide electrode comprises source/drain electrodes in a pMOS transistor.

14. The method as recited in claim 1, wherein an interface between said metal silicide electrode and said semiconductor substrate has an average roughness of less than about 40 percent.

15. The method as recited in claim 1, wherein said metal silicide electrode has an average thickness that is between about 1 time and 3 times a thickness of said alloy layer.

16. The method as recited in claim 1, wherein said metal silicide electrode has a thickness of between about 10 nanometers and about 60 nanometers.

* * * * *